United States Patent
Kummer et al.

(10) Patent No.: US 6,663,784 B1
(45) Date of Patent: Dec. 16, 2003

(54) METHOD FOR PRODUCING THREE-DIMENSIONAL STRUCTURES BY MEANS OF AN ETCHING PROCESS

(75) Inventors: Nils Kummer, Ludwigsburg (DE); Roland Mueller-Fiedler, Leonberg (DE); Klaus Breitschwerdt, Filderstadt (DE); Andre Mueller, Gerlingen (DE); Frauke Driewer, Ettlingen (DE); Andreas Kern, Weingarten (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 09/890,080
(22) PCT Filed: Jan. 26, 2000
(86) PCT No.: PCT/DE00/00212
§ 371 (c)(1),
(2), (4) Date: Feb. 4, 2002
(87) PCT Pub. No.: WO00/44667
PCT Pub. Date: Aug. 3, 2000

(30) Foreign Application Priority Data

Jan. 28, 1999 (DE) .......................................... 199 04 307

(51) Int. Cl.⁷ ............................ H01L 21/00; B44C 1/22
(52) U.S. Cl. ............................ 216/2; 216/26; 216/59; 216/67; 216/79; 438/9; 438/714
(58) Field of Search ................... 216/2, 26, 41, 216/59, 67, 79; 438/9, 714, 719, 734

(56) References Cited

U.S. PATENT DOCUMENTS 5,286,338 A 2/1994 Feldblum et al.

FOREIGN PATENT DOCUMENTS

| DE | 42 41 045 | 5/1994 |
|----|-----------|--------|
| DE | 197 36 370 | 3/1999 |
| WO | WO 97 25653 | 7/1997 |

Primary Examiner—William A. Powell
(74) Attorney, Agent, or Firm—Kenyon & Kenyon

(57) ABSTRACT

A method is proposed for producing three-dimensional structures, especially microlenses, in a substrate using an etching process, at least one original shape having a known original surface shape being present initially on the substrate in a plurality of places. The etching process has at least one first etching removal rate $a_1$ and a second etching removal rate $a_2$ which are material-dependent, and of which at least one is changeable as a function of time. The original shape is converted to a target shape by the etching process, the original surface shape of the original shape and the target surface shape of the target shape to be reached being known before the beginning of the etching process. In order to achieve the target surface shape, at least one of the etching rates $a_2$ or $a_1$ is set by a change of at least one etching parameter calculated before the beginning of the etching process as a function of the etching time.

20 Claims, 2 Drawing Sheets

US 6,663,784 B1

METHOD FOR PRODUCING THREE-DIMENSIONAL STRUCTURES BY MEANS OF AN ETCHING PROCESS

FIELD OF THE INVENTION

The present invention relates to a method for producing three-dimensional structures using an etching process.

BACKGROUND INFORMATION

Methods, and the equipment for carrying them out, are known for etching silicon or for producing microlenses from a silicon substrate. German Patent No. 42 41 045 discusses an inductive coupled plasma source used for silicon deep-etching at very high etching rates, and discusses using an inductive high frequency excitation in order to liberate fluorine radicals from a fluorine supplying etching gas and $(CF_2)_x$ radicals from a passivating gas delivering teflon-forming monomers. The plasma source here generates a high-density plasma having a relatively high density of ions ($10^{10}$–$10^{11}$ cm$^{-3}$) of low energy, while etching and passivating gases for etching trenches into a masked silicon wafer are used alternatingly in an empirically determined time sequence.

It has further already been proposed in unpublished German Patent Application No. DE 197 363 70.9 to influence the material-dependent etching removal rate as a function of time during etching of a silicon wafer by means of so-called "parameter-ramping", so as in this manner to reduce the profile deviations of etched structures in the silicon wafer.

However, the named methods can be used only for making an etching process, which is isotropic per se, locally anisotropic, and thus, for example, for etching trenches of defined depth and good profile fidelity. However, they do not offer the possibility of transforming a three-dimensional original shape, positioned on a substrate, in a controlled manner into a three-dimensional target shape having a defined surface shape.

Particularly in the production of microlenses, whereby at first an optical surface is generated by melted-on polymers, such as a photoresist, by reason of their surface tension, and this optical surface is then transferred by a dry etching process into an inorganic substrate material, such as silicon, for IR optics, the problem exists of transferring this surface shape of the melted-on polymers during the etching process into the substrate and of simultaneously changing the surface shape of the original polymer in a targeted way to a desired surface shape of the microlens in the substrate material.

During melting on of the polymers, disregarding gravitational forces, with appropriately small lenses and free adjustment of the contact angle, in general, spherical surfaces are created, as are also used for macroscopic lenses. However, in lenses having greater diameters, i.e. several mm, if the influence of gravitational forces can no longer be ignored, aspherical surfaces of the melted-on polymer materials are created, as is well known, which, having circular base planes, are cylindrically symmetrical, and, when projected into the xz-plane of the coordinate system can be described by conical functions $h_U(x)$, with $h_U(x)$ given by $$h_U(x) = H_1 - \frac{R_1 - \sqrt{R_1^2 - (1+K_1)x^2}}{1+K_1}$$

having a radius of curvature $R_1$, a lens height $H_1$ and a conical constant $K_1 \neq 0$. After the etching process in the known etching methods, these aspherical surfaces can be seen again transferred to the substrate, and here, moreover, it frequently happens that the conical constant $K_1$ in the melted-on polymer as original shape changes to conical constant $K_2$ during etching and thus during forming of the original shape into the substrate.

Thus is created a likewise aspherical microlens in the substrate, having, however, different optical properties than would have been expected on the basis of the shape of the melted-on polymer. A sufficient correction or avoidance of this aspherical surface of the microlenses is often not possible using known static etching processes, even when they have different etching removal rates for the substrate material and for the polymer.

As a rule, this is due to a very high conical constant of the original shape of the polymer, a volume change of the original shape by the etching process, or a time-dependent variation of the etching parameters during the etching process, such as by heating of the substrate when cooling is faulty.

The relationship of the etching removal rate of the substrate material to that of the original shape material, by the way, is designated as the selectivity S. Known static etching processes, therefore, have constant selectivities.

Furthermore, it is already known that, in the case of photoresist lenses having a diameter of several mm, at first conical constants with $K_1 < -100$ set in. From these, and at a selectivity of S=4 which is beneficial for the surface quality of the lenses, known static etching processes can be used only to produce microlenses in a silicon substrate which have a conical constant $K_2 < -5$. In particular, a desired setting of $K_2 = 0$, that is, a spherical lens, is not possible.

SUMMARY OF THE INVENTION

The procedure according to the invention has the advantage, compared to the related art, that it is suitable for producing three-dimensional structures such as, for instance, spherical microlenses of mostly any size at all, in a substrate such as silicon, there being initially in a plurality of places particularly on the substrate at least one original shape having a known original surface shape. Because the etching removal rates for the substrate material and the original shape material differ definitively and, at the same time, they can be selectively set by setting apparatus etching parameters as a function of time, so that the selectivity of the etching process changes definitively with time, therefore the original surface shape can be transferred during the etching process to a desired and predefined target surface shape. This is carried out advantageously in that the original shape is removed during the etching process, and in its place a target shape is structured from the substrate.

Apart from a few apparatus influences which have to be determined by test etchings, the calculation of the required time-related change of the etching removal rates is made before beginning the etching, exclusively using the known surface shape of the original shape and that of the target shape, so that a steady control of the etching process, costly empirical experiments for reaching a desired target shape, and a continuous determination of the surface shape reached up to this point of the target shape as a function of etching time, are not necessary.

To facilitate the calculation, it is very advantageous if the original surface shape can be described at least approximately by an initial function, $h_U$ in particular, explicitly known before start of the etching process, and if the target surface shape can be described at least approximately by a target function, $H_S$ in particular, explicitly known before start of the etching process.

The apparatus setting of at least one etching parameter as a function of time during the etching process takes place advantageously and in a known manner, for example, by the change of the flow of at least one of the etching gases being used, the concentration and/or composition of the etching gas being used, the process pressure in the plasma etching chamber, the voltage applied to the substrate, the substrate temperature, or the coil voltage of ICP plasma equipment. A computer controlled and operated control unit is especially suitable for setting the individual parameters. In this connection, one may use especially the advantageous property that the etching removal rates also depend on the material.

Starting from an original shape present on the substrate, the method according to the present invention permits in a simple way structuring a desired target shape from the original shape.

Thus, it is simply and advantageously possible to convert an aspherical lens having a circular base plane as the original shape, which is made, for example, of melted-on polymer such as a photoresist, which is present on a silicon substrate or another semiconductor substrate, and whose surface can be described by a conical function, into a spherical microlens structured from the silicon substrate during the etching process.

Thus, with the aid of the method according to the present invention, a clearly improved optical quality of microlenses is achieved, and particularly when working with larger microlenses the development process is clearly shortened, since extensive tests and etchings, while varying the etching parameters, become unnecessary.

Advantageously, however, the method according to the present invention is neither tied to special materials or compositions of the original shape nor to the target shape to be achieved, as long as suitable etching processes known per se are available.

Then, too, the possible surface shapes of the original and the target shapes for the method according to the present invention advantageously encompass multiple geometrical formations, and are not limited to shapes such as aspherical microlenses which have, up to now, been particularly important in practice.

The method according to the present invention is especially suitable for producing three-dimensional structures having a circular base area and a surface shape cylindrically symmetrical to the z-axis of the coordinate system, since, in this case, in the substrate plane defined by the substrate, etching with equal removal rates or equal selectivity takes place at all locations, which only changes as a function of time.

However, in principle it is also possible, using the etching method according to the present invention, to change at least one of the etching parameters or the selectivity as a function of the location on the substrate surface and/or as a function of time, so that, for example, the etching removal rates for original and target shapes can be not only a function of time, but also of the location coordinates x and y. This continuation of the method according to the present invention, which only requires a greater computing effort for the calculation of the changes to be set in the etching parameters, is as yet, however, not of practical significance, since the corresponding etching equipment is still not available. For etching parameters variable as a function of the spatial coordinates and of etching time, the temperature of the substrate or the substrate voltage for example, come into consideration.

In particular, using the method according to the present invention, it is advantageously possible, starting from an original shape having a circular base area and a surface shape described by a first conical function $h_U$ having a radius of curvature $R_1$, a conical constant $K_1$ and height $H_1$, to convert this, via a time-related variation of at least one etching parameter calculated before the etching process, into a target shape in a substrate whose surface shape is described by a second conical function $H_S$ having a radius of curvature $R_2$, conical constant $K_2$ and height $H_2$. In the especially relevant case where $K_2=0$, in this manner one advantageously attains, in particular, a spherical target shape, while in the case of $K_1 \neq K_2$ one can convert in targeted manner the first conical function, which describes the surface shape of the original shape, into the second conical function which describes the surface shape of the target shape. A particularly simple case of this method arises advantageously in the case which is especially important in practice, that the heights $H_1$ and $H_2$ and/or the radii of curvature $R_1$ and $R_2$ are equal. Thus, the method according to the present invention permits advantageously producing a spherical target shape from an aspherical original shape.

The method according to the present invention further proceeds especially simply if, during the etching process, the etching removal rate of a material such as the substrate material, is held at least substantially constant, and only the etching removal rate of the other material, such as the original shape material, is changed as a function of time via the etching parameters. This reduces the computing effort before etching, increases the reliability and precision of the respectively set etching parameters and the reproducibility of the etching results.

In order to be able to take into account etching equipment-connected deviations in the etching removal rate and the selectivity arising during the etching process, which are not at first taken into consideration in the calculation, and which lead to deviation in the actually achieved surface shape of the desired shape and the surface shape of the target shape taken into account in the calculation, advantageously a test etching can at first be undertaken in addition, the time-related change of the etching parameters yielded by the calculation in view of the surface shape of the original shape (described by the function $h_U$) and the desired surface shape of the target shape (described by the function $H_S$) being used at first. After that, a surface shape often sets in at first which deviates slightly from the desired surface shape of the (K target shape and which is described by a function $H_{S,Test}$. In order to be able to at least offset this deviation in the first place, after that, advantageously, in all further etching processes an advance calculation of the change of the etching parameters for converting the original shape into the target shape having a newly defined function is undertaken, $$h_{S,new}=2h_S-h_{S,Test}$$

which takes the place of the formerly used function $h_S$.

DETAILED DESCRIPTION

Figure 1:
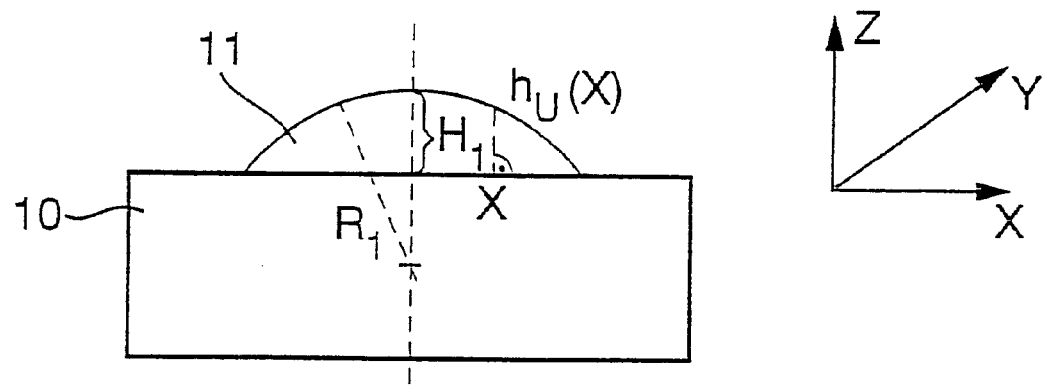
FIG. 1 shows a block diagram of an original shape on a substrate material before the etching process.

FIG. 1 shows a substrate 10 made of a silicon wafer, on which there is, in a plurality of places, a melted-on photoresist as original shape 11. The surface of substrate 10 lies within the plane defined by the coordinate axes x and y. Original shape 11 has the form of an ellipsoid symmetrical to the z-axis, or a conical section having a circular base area. The surface of original shape 11 is described by an original function $h_U$, whose projection on the xz plane of the coordinate system is given by the conical function $$h_U(x) = H_1 - \frac{R_1 - \sqrt{R_1^2 - (1+K_1)x^2}}{1+K_1} \tag{1}$$

where $H_1$ denotes a height, $R_1$ a radius of curvature and $K_1$ a conical constant, which here is not equal to 0, and, in particular, lies between 0 and −200. The magnitude $h_U(x)$ here denotes in the projection the specific distance of the surface of original shape 11 from substrate 10 as a function of x according to FIG. 1. The origin of the x-axis is located, as it also is in all remaining explained cases, at the center of the circular base area of original shape 11 and target shape 12, respectively.

Figure 2:
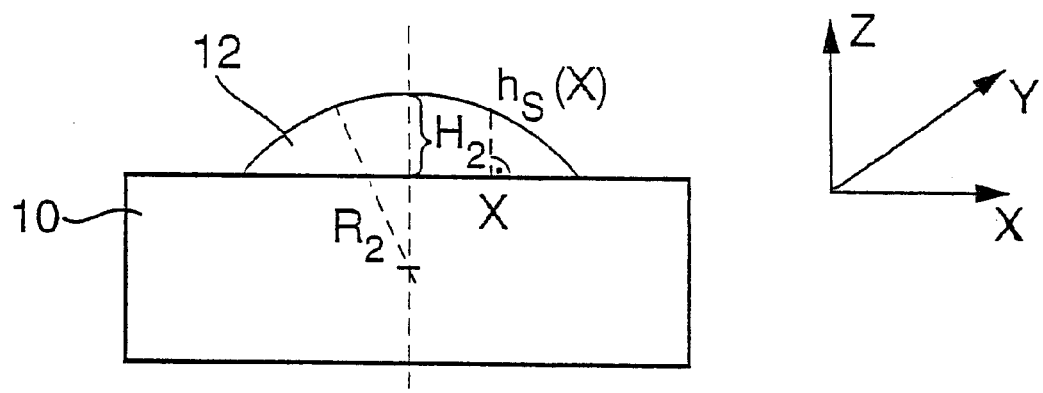
FIG. 2 shows a block diagram of a target shape made of a substrate material after the etching process.

FIG. 2 shows how, starting from FIG. 1, original shape 11 is converted to a target shape 12, patterned out from substrate 10, using, for example, an etching procedure known from German Patent No. DE 42 41 045, in which an inductive coupled plasma source is used. The surface shape of target shape 12 is described by a target function $h_S$, whose projection onto the xz plane of the coordinate system is given by the conical function $$h_S(x) = H_2 - \frac{R_2 - \sqrt{R_2^2 - (1+K_2)x^2}}{1+K_2} \tag{2}$$

where $H_2$ is a height, $R_2$ is a radius of curvature and $K_2$ is a conical constant. In this case, the magnitude $h_S(x)$ in projection is again understood to represent the distance of the surface of the target shape from the substrate base area as a function of x, according to FIG. 2.

In this exemplary embodiment the conical constant is given by $K_2=0$, that is, target shape 12 has a spherical surface shape, so that, for example, in the production of microlenses, an aspherical original shape 11 is converted into a spherical target shape 12. For the radii of curvature, $R_1 \neq R_2$ applies. However, it should be emphasized that the method according to the present invention can also be carried out using substantially more general original functions and target functions, which, however, have had little practical significance up to now.

Typical dimensions of original shape 11 and target shape 12 are a diameter of the base area of approximately 1 to 10 mm, a height of 0.1–5 mm and a conical constant of 0 to −200. However, since the conical functions describe conical sections (ellipses, parabolas, hyperbolas), positive conical constants are also conceivable. Overall, therefore, with these definitions, the target function $h_S$ now takes on the simpler form $$h_S(x) = H_2 - R_2 + \sqrt{R_2^2 - x^2} \tag{3}$$

Furthermore, the etching procedure for the substrate material (for example, silicon) has an etching removal rate $a_2$ and for the original shape material (for example, a polymer or photoresist) an etching removal rate $a_1$, which can both be changed as a function of time by apparatus etching parameters. In this exemplary embodiment, etching removal rate $a_1$ in the photoresist, defined as a function of time, is changed via a time-related change of the etching gas flow or the etching gas concentration, whereas etching removal rate $a_2$ is at least substantially held constant.

When working with static etching processes having time-related and locally constant etching removal rates $a_1$ and $a_2$, and a selectivity S, which is defined by $$S(t) = \frac{a_2(t)}{a_1(t)} = \frac{a_2}{a_1} = S \tag{4}$$

conical constant $K_2$ in formula (1) changes as a function of selectivity S and a given conical constant $K_1$ from formula (2), in this simple case, as in the formula $$K_2 = \frac{K_1 + 1}{S^2} - 1 \tag{5}$$

For the dynamic etching process according to the present invention, having a time-related change of the etching removal rate $a_1(t)$ in the photoresist and an etching time $T_1(x)$, which states how much time is required for etching at a location x until the substrate is reached, together with formula (1) the following applies:

$$\int_0^{T_1(x)} a_1(t)dt = h_U(x) = H_1 - \frac{R_1 - \sqrt{R_1^2 - (1+K_1)x^2}}{1+K_1} \tag{6}$$

Correspondingly, for the silicon substrate, using formula (3) and especially $K_2=0$, the following applies:

$$\int_{T_1(x)}^T a_2(t)dt = \int_{T_1(x)}^T a_1(t)S(t)dt = h_S(x) = H_2 - R_2 + \sqrt{R_2^2 - x^2} \tag{7}$$

Here the entire etching time is denoted by T. Furthermore, with the definition $$A(t) = \int_0^t a_1(t)dt \tag{8}$$

and $$SA(t) = \int_t^T a_1(t)S(t)dt \tag{9}$$

where A(t) is the total etching depth reached in the photoresist and SA(t) is the total etching depth reached in the silicon substrate after time t, the following apply:

$$h_U(x) = A(T_1(x)) \tag{10}$$

and $$h_S(x) = SA(T_1(x)) \quad (11)$$

Differentiating by x, using the chain rule, the following differential equations result:

$$T_1'(x)a_1(T_1(x)) = h_U(x) = -\frac{x}{\sqrt{R_1^2 - (1+K_1)x^2}} \quad (12)$$

$$T_1'(x)a_1(T_1(x))S(a_1(T_1(x))) = h_S'(x) = -\frac{x}{\sqrt{R_2^2 - x^2}} \quad (13)$$

From that, then, is determined the location-dependent selectivity at the location of the transition from photoresist (original shape 11) to silicon substrate (target shape 12), that is, at the edge of each remaining original shape (11), as:

$$S(a_1(T_1(x))) = \sqrt{\frac{R_1 - (1+K_1)x^2}{R_2^2 - x^2}} \quad (14)$$

The function $S=S(a_1)$ is known according to formula (14) for the specific etching installation used, or, by varying the installation parameters in the manner described, it can be set in a targeted manner as a function of time during the changing of the etching parameters.

This gives the etching removal rate $a_1(t)$ at each respective location x, changing during the course of the etching process, of the transition from photoresist to silicon substrate, with the aid of (14) by forming the inverse function $$a_1(T_1(x)) = S^{-1}\left(\sqrt{\frac{R_1 - (1+K_1)x^2}{R_2^2 - x^2}}\right) \quad (15)$$

From this, together with formula (12), one can first of all calculate $T_1'(x)$.

By integration this function then yields the required etching time in photoresist $T_1(x)$ until the substrate is reached as a function of each location x.

Forming the inverse function, this in turn yields the function $T_1^{-1}(t)$, which is by now only dependent on time.

Finally, one obtains with this the desired etching removal rate in the photoresist, by now only dependent on time, as:

$$a_1(t) = a_1(T_1(T_1^{-1}(t))) \quad (16)$$

from which one can also at once calculate the time-dependent selectivity S.

Thus, by stipulating the two functions $h_U(x)$ and $h_S(x)$, the time-dependent change of at least one etching parameter, which, starting from the surface shape of original shape 11 is required for reaching a specified surface shape of target shape 12, is specified as a function of time.

This calculation, done with the aid of a computer program, is thus immediately followed by a time-dependent variation, known per se, of one etching parameter, such as of the etching gas concentration or etching gas flow, which leads to the required time-dependent change of the selectivity or at least one of the two etching removal rates $a_1$ or $a_2$. In the explained example, only the etching removal rate $a_1$ was changed.

The time-related variation of the apparatus etching parameters, determined from the calculation, also takes place advantageously via a computer control unit, which sets the values calculated ahead of time in each case at the correct point in time during the etching process. Thus, all further etchings of equal geometrical shape of the original shape and the target shape can be carried out, using a set of parameters calculated just once.

In summary, and briefly, a possible procedural sequence of the explained example would have the following steps:

1. First specify $K_1, R_1, H_1$ (original shape 11), as well as $K_2$, $R_2$ and $H_2$ (target shape 12), where here especially $K_2=0$.
2. Determine next the function $S(t)$, which is yielded as a function of etching removal rate $a_1$ if for no other reason than equipment-specific and process-specific properties, experimentally as a function of etching time with etching parameters externally held constant, and approximate this apparatus-specific function, for easier handling, for example, with a polynomial of higher order.
3. With these givens in place, all selectivities (as an interval, but not as a function of time from (14)) needed in the subsequent etching process are immediately known. This is also particularly true for their maxima and minima, so that the boundary conditions or extreme conditions are already in hand for the following calculations.
4. Now calculate the function $a_1(T_1(x))$, using formula (4) and (5) and (11) and (12), respectively, and obtain the spectrum of the possible etching removal rates $a_1(T_1(x))$.
5. Then determine $T_1'(x)$ from formula (12).
6. Finally integrate, especially numerically, the function $T_1'(x)$ with the boundary condition, such that the etching time at the edge of the original shape 11, that is, at the location of the transition to substrate 10, is zero, and thereby obtain $T_1(x)$.
7. Now, since functions $a_1(T_1(x))$ and $T_1(x)$ are known, form the function $T_1^{-1}(x)$ given as a function of t, for instance, numerically, and finally substitute this into formula (16), so as to obtain $a_1(t)$ as the desired result.

Figure 3:
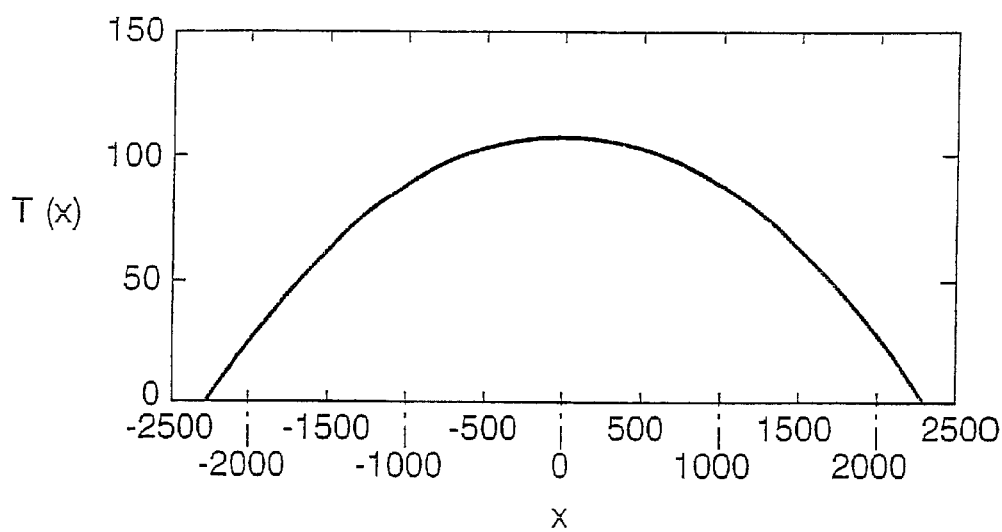
FIG. 3 shows a representation of resist etching time $T_1(x)$ [min] as a function of locality x [μm].
Figure 4:
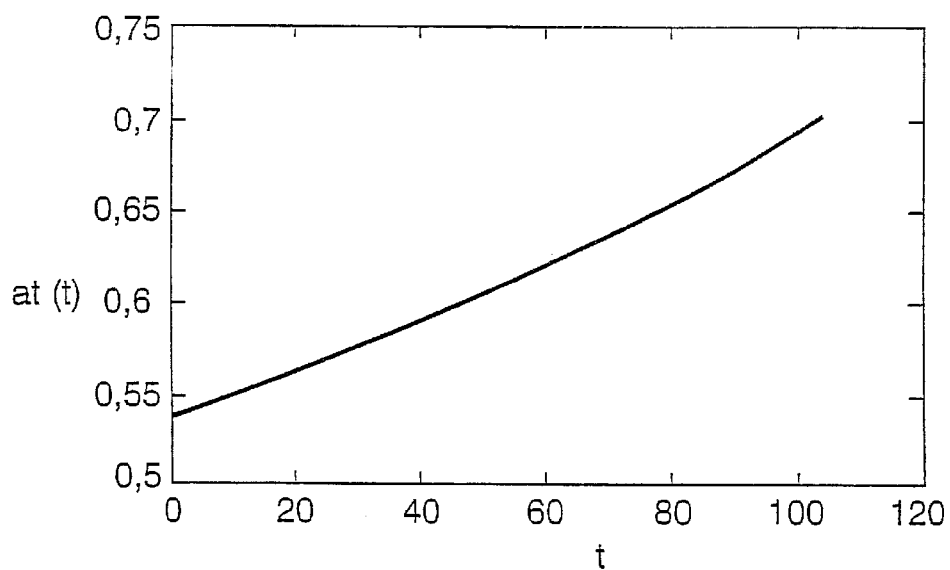
FIG. 4 shows a representation of the resist etch removal rate $a_1(t)$ [μm/min] as a function of etching time t [min].
Figure 5:
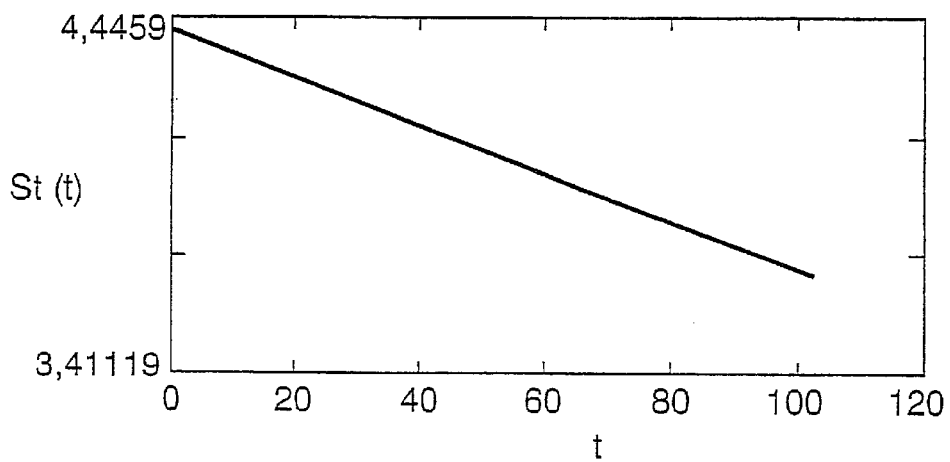
FIG. 5 shows a representation of the selectivity S(t) as a function of the etching time t [min].

FIG. 3 shows, as explanation for an original shape 11 made of a photoresist and a target shape made of silicon in a silicon substrate 10, a graph, resulting from the calculation, of the resist etching time $T_1(x)$ in minutes as a function of the locality x in μm. FIG. 4 shows a corresponding graph of the resist etching removal rate $a_1(t)$ in μm/min, calculated as a function of etching time t [min]. FIG. 5 shows, finally, the corresponding graph of selectivity $S(t)$ as a function of etching time t [min]. It should be pointed out that both functions in FIGS. 4 and 5 are not straight lines.

In a second exemplary embodiment, the method described in the first exemplary embodiment is carried out somewhat modified.

First, the method described is carried out in a test etching as described in the first exemplary embodiment. In case a surface shape of target shape (12) appears after that, which deviates from the function that is desired and included in the calculation, as in formula (7)

$$h_S(x) = H_2 - R_2 + \sqrt{R_2^2 - x^2} \quad (7)$$

which can be caused by etching equipment-related deviations in the etching removal rates and the selectivity, appearing during the etching process and at first not considered in the calculation, which lead to a conical constant $K_2 \neq 0$, one determines experimentally the created surface shape of target shape 12 and describes it functionally by the notation $H_{S,Test}$ together with constants $K_3$ and $R_3$ determined experimentally after the test etching, according to $$h_{S,Test}(x) = H_3 - \frac{R_3 - \sqrt{R_3^2 - (1+K_3)x^2}}{1+K_3} \quad (17)$$

instead of the function actually to be expected on account of the calculation $$h_S(x) = H_2 - R_2 + \sqrt{R_2^2 - x^2} \quad (7)$$

For the adjustment of this surface shape which results after the test etching and is at first slightly faulty, in a first order approximation using formulas (17) and (7), a new function $$h_{S,new}(x) = 2h_S(x) - h_{S,Test}(x) \quad (18)$$

is defined, which takes the place of the formerly used function $h_S(x)$.

Using this function for describing the surface shape of target shape 12, the calculation according to the first exemplary embodiment is then carried out anew, together with the original function $h_U(x)$ for describing the surface shape of original shape 11, and the result is then used finally during the further etchings in the form of a defined time-related change of $a_1(t)$ via corresponding etching parameters. Through this, the mentioned etching equipment-conditioned deviations can be compensated, and during these further etchings one obtains a surface shape of target shape 11 which comes at least very close to the surface shape desired, which is described by function $H_S(x)$.

It is evident that the explained exemplary embodiments are neither limited to the respective substrate materials and original shape materials, nor to the special surface shapes of original shape 11 and target shape 12, but rather that they can be generalized in a simple manner.

What is claimed is:

1. A method for producing a three-dimensional structure in a substrate using an etching process according to a first etching removal rate and a second etching removal rate, at least one of the first etching removal rate and the second etching removal rate being changeable as a function of time, the method comprising the steps of:
   initially providing in a plurality of places on the substrate at least one original shape including a known original surface shape;
   converting the at least one original shape by the etching process into a target shape having a target surface shape that is different from the known original surface shape;
   calculating at least one etching parameter as a function of an etching time before a beginning of the etching process, the at least one etching parameter being calculated from the known original surface shape and the target surface shape; and
   setting at least one of the first etching removal rate and the second etching removal rate via a change of the at least one etching parameter in order to achieve during the etching process the target surface shape.

2. The method of claim 1, wherein the three-dimensional structure is a microlens.

3. The method of claim 1, wherein;
   the known original surface shape is described, at least approximately, by an original function $h_u$ known before the beginning of the etching process, and
   the target surface shape is described, at least approximately, by a target function $h_S$ known before the beginning of the etching process.

4. The method of claim 1, wherein the first etching removal rate and the second etching removal rate are set by an apparatus setting the at least one etching parameter as a function of time.

5. The method of claim 4, wherein the first etching removal rate and the second etching removal rate are material-dependent.

6. The method of claim 1, wherein the target shape is patterned out of the substrate.

7. The method of claim 1, wherein the etching process uses the first etching removal rate for the at least one original shape and uses the second etching removal rate for a material of the substrate.

8. The method of claim 4, wherein the at least one etching parameters includes:
   a flow of at least one etching gas,
   at least one of a concentration of the at least one etching gas and a composition of the at least one etching gas,
   a process pressure,
   a voltage applied to the substrate,
   a substrate temperature, and
   a coil voltage.

9. The method of claim 7, wherein:
   the second etching removal rate of the substrate material is at least substantially held constant, and
   the first etching removal rate of the at least one original shape is changed as a function of time via the at least one etching parameter.

10. The method of claim 1, wherein at least one of the at least one original shape and the target shape has an at least approximately circular base area.

11. The method of claim 1, wherein at least one of the at least one original shape and the target shape are cylindrically symmetrical with respect to a z-axis of a coordinate system.

12. The method of claim 1, wherein:
    the known original surface shape is described by a cylindrically symmetrical original function $h_U$, a projection of the function $h_u$ on an xz-plane of a coordinate system described at least approximately by a conical function $$h_U(x) = H_1 - \frac{R_1 - \sqrt{R_1^2 - (1+K_1)x^2}}{1+K_1}$$

having a conical constant $K_1$, a radius of curvature $R_1$, and a height $H_1$, and
    the target surface shape is described by a cylindrically symmetrical target function $h_S$, a projection of the function $h_S$ on the xz-plane of the coordinate system described at least approximately by a conical function $$h_S(x) = H_2 - \frac{R_2 - \sqrt{R_2^2 - (1+K_2)x^2}}{1+K_2}$$

having a conical constant $K_2$, a radius of curvature $R_2$, and a height $H_2$.

13. The method of claim 12, wherein at least one of the following is true:
    the height $H_1$ is equal to the height $H_2$,
    the radius of curvature $R_1$ is equal to the radius of curvature $R_2$, and
    the conical constant $K_2$ is equal to 0.

14. The method of claim 12, wherein at least one of the following is true:

the height $H_1$ is equal to the height $H_2$, the radius of curvature $R_1$ is equal to the radius of curvature $R_2$, and the conical constant $K_2$ is not equal to the conical constant $K_1$.

15. The method of claim 3, further comprising the step of:

in order to correct at least one etching apparatus-conditioned deviation, performing a test etching using a change of at least one of the first etching removal note and the second etching removal rate calculated initially as a function of time, wherein:

after the test etching, a function $h_{S,test}$ sets in, the function $h_{S,test}$ describing the predefined target surface shape, and after the function $h_{S,test}$ sets in, a new target function $h_{S,new}$ is given by $$h_{S,new} = 2h_S - h_{S,Test}$$

the new target function $h_{S,new}$ being used together with the original function $h_U$ to calculate a time-related change of the at least one etching parameter, the new target function $h_{S,new}$ being used in order to reach the target surface shape for the target shape for at least one further etching.

16. The method of claim 15, wherein after the test etching, the target surface shape sets in, a projection of the target surface shape on an xz-plane of the coordinate system given by $$h_{S,Test}(x) = H_3 - \frac{R_3 - \sqrt{R_3^2 - (1+K_3)x^2}}{1+K_3}.$$

17. The method of claim 1, wherein the at least one original shape is made of a polymer.

18. The method of claim 17, wherein the at least one original shape is made of at least one of a masking material and a photoresist.

19. The method of claim 1, wherein a material of the substrate is one of made of a semiconductor and includes the semiconductor.

20. The method of claim 19, wherein the semiconductor includes silicon.

* * * * *

UNITED STATES PATENT AND TRADEMARK OFFICE
CERTIFICATE OF CORRECTION

PATENT NO. : 6,663,784 B1
DATED : December 16, 2003
INVENTOR(S) : Kummer et al.

It is certified that error appears in the above-identified patent and that said Letters Patent is hereby corrected as shown below:

Column 4,
Line 54, delete "(k".

Signed and Sealed this

Twenty-third Day of November, 2004

JON W. DUDAS
*Director of the United States Patent and Trademark Office*